July 19, 1966 M. A. CRANDALL 3,262,072

HIGH FREQUENCY VOLTAGE CONTROL TRANSISTOR OSCILLATOR CIRCUIT

Filed July 17, 1964

INVENTOR

MILTON A. CRANDALL

BY Edwin E. Greigg

ATTORNEY

United States Patent Office
3,262,072
Patented July 19, 1966

3,262,072
HIGH FREQUENCY VOLTAGE CONTROL TRANSISTOR OSCILLATOR CIRCUIT

Milton A. Crandall, Flushing, N.Y., assignor to Simmonds Precision Products, Inc., Tarrytown, N.Y., a corporation of New York Filed July 17, 1964, Ser. No. 383,388
2 Claims. (Cl. 331—117)

This invention relates to an improved voltage control oscillator. More particularly, the invention provides for an extension of upper frequency limitations and an increase in tuning range over existing radio frequency voltage control oscillators.

The invention is related to systems utilizing logic circuit components for controlling an oscillator in order to synthesize frequencies in the very high frequency and ultra high frequency range. A system of this nature which forms no part of the present invention is more particularly described and claimed in a copending application Ser. No. 359,196 filed April 13, 1964, and assigned to the same assignee to which the present application is assigned.

In conventional grounded-base oscillators, such as the well-known Colpitts type, there is ordinarily provided a tuning circuit and a capacitive voltage divider for providing feedback to sustain oscillations. For this kind of circuit the frequency of oscillation is approximated by the following formula:

$$F=\frac{1}{2\pi\sqrt{L_1\left(C_1+\frac{C_2C_3}{C_2+C_3}\right)}}$$

wherein $L_1$ and $C_1$ are the tuned circuits and $C_2$ and $C_3$ are a capacitive voltage divider. This particular circuit tends to maintain relatively constant output over a reasonably wide range of frequencies due to the fact that with a decrease in the impedance of $L_1$, $C_1$, a feedback is simultaneously increased with the increase of $C_2$ and $C_3$. The tuning range of this arrangement is limited, however, by the fact that as a practical matter, $C_1$, $C_2$ and $C_3$ may not easily be reduced below a certain minimum value.

Accordingly, one object of the present invention is to provide a unique circuit arrangement for radio frequency voltage control oscillators in which the upper frequency limitations and the tuning range are extended.

It is a further object of the present invention to provide a circuit arrangement for a grounded-base oscillator in which the associated capacitance values are of an unusually high order.

It is still yet another object to provide a circuit arrangement for a voltage control oscillator in which varactors are used in the capacitive portion of the circuit, thus allowing the oscillator to be voltage tuned over a wider range than is practical with the basic Colpitts circuit.

Other objects and advantages of this invention will become apparent in the following description and in view of the accompanying drawings in which.

Figure 1:
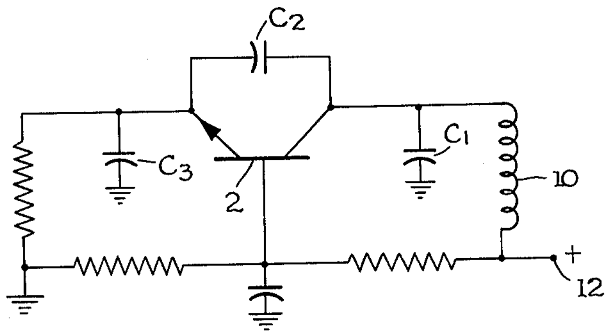
FIG. 1. PRIOR ART
FIG. 1 is a circuit diagram of a Colpitts circuit.

Referring now to FIG. 1, there is shown an oscillator comprising a transistor 2 in which a parallel tuned tank circuit including a power supply 12 and inductance 10 and a capacitor $C_1$ is connected between the base and collector of the transistor 2. Two voltage dividing capacitors $C_2$ and $C_3$ are provided in series with their common connection at emitter potential. Constant output over a wide range of frequencies is effected by operation of voltage divider feedback circuit as above described. The tuning range of this arrangement is limited however, by the fact that as a practical matter, the capacitors $C_1$, $C_2$ and $C_3$ may not easily be reduced below a certain minimum value.

Figure 2:
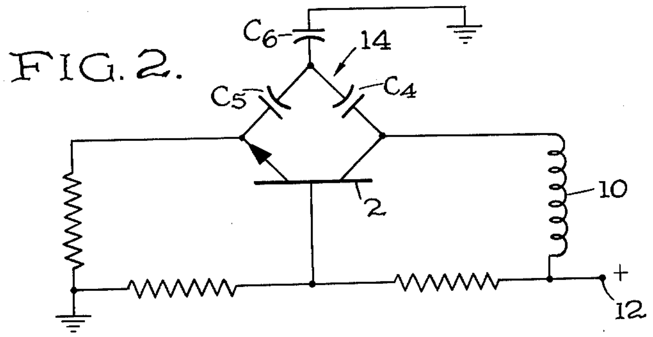
FIG. 2 is a circuit diagram embodying the present invention.
Figure 3:
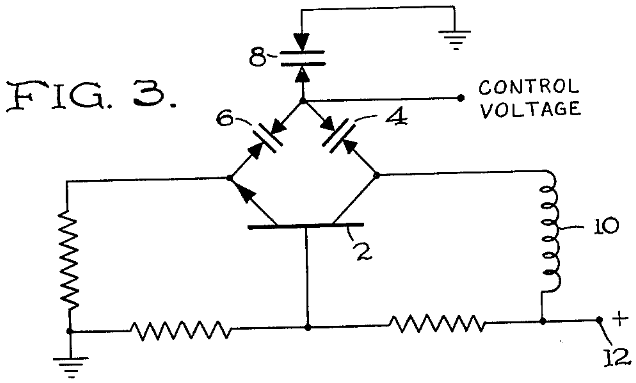
FIG. 3 is a circuit diagram of a modification of the FIG. 2 embodiment.

Examination of FIG. 1 will show that the capacitors $C_1$, $C_2$ and $C_3$ are connected as a three terminal network in a delta configuration. Referring now to FIG. 2 in which the same numerals designate elements which have their equivalent in FIG. 1 there is shown, according to the present invention, a Y configuration of capacitances 14 which replaces the delta of capacitances in FIG. 1. This circuit will give superior performance to the Colpitts oscillator in FIG. 1 when the capacitor valves are such that the impedances at the three network terminals are identical. For the impedances to be the same in the Y connection, however, capacitor valves $C_4$, $C_5$ and $C_6$ must be increased. For similar capacitance valves therefore the circuit operates at much higher frequencies. In FIG. 3 the capacitances are replaced by varactors 4, 6 and 8, which allow the oscillator to be voltage-tuned over a wider range than is practical with a basic Colpitts circuit.

A breadboard version utilizing a 2N918 transistor was constructed and tested to tune from 84 to 170 megacycles and deliver more than one milliwatt to a 50 ohm load over that range. The capacitance valves were unusually large for a circuit operating at these frequencies, indicating therefore the effectiveness of the Y configuration. The tuning range of an octave is also unusual for a VHF oscillator.

In addition to the breadboard design of the oscillator embodied in the present invention, a thin film microcircuit design on a ceramic substrate was utilized. The latter design exhibited performance superior to the breadboard design with a frequency of 90 to 210 megacycles, well over an octave.

Although several embodiments of the invention have been depicted and described, it will be apparent that these embodiments are illustrative in nature and that a number of modifications in the apparatus and variations in its end use may be effected without departing from the spirit or scope of the invention as defined in the appended claims.

What I claim is:

1. A grounded-base transistor for producing oscillations comprising a base-collector circuit including an inductance for tuning said circuit and a collector-emitter feedback circuit having a plurality of capacitance voltage divider means arranged in a Y configuration such that the collector, emitter and ground constitute end terminals of said Y configuration, said voltage divider means comprises varactors having a common connection to which a voltage is applied for varying the frequency of oscillation.

2. A grounded-base transistor for producing oscillation in the very high frequency range comprising in combination a base-collector circuit including an inductance for tuning said circuit and a collector-emitter feedback circuit including first, second and third varactors arranged in a Y configuration and having a common connection, said emitter and ground constituting terminal ends respectively for said first, second and third varactors.

References Cited by the Examiner

UNITED STATES PATENTS

| | | | |
|---|---|---|---|
| 3,042,870 | 7/1962 | Minner et al. | 331—117 |
| 3,192,487 | 6/1965 | Noordanus et al. | 331—117 |

ROY LAKE, *Primary Examiner.*

JOHN KOMINSKI, *Examiner.*